United States Patent [19]
Ackley et al.

[11] Patent Number: 5,446,752
[45] Date of Patent: Aug. 29, 1995

[54] VCSEL WITH CURRENT BLOCKING LAYER OFFSET

[75] Inventors: Donald E. Ackley, Lambertville, N.J.; Chan-Long Shieh, Paradise Valley; Michael S. Lebby, Apache Junction, both of Ariz.; Hsing-Chung Lee, Calabasas, Calif.; Piotr Grodzinski, Chandler, Ariz.

[73] Assignee: Motorola, Schaumburg, Ill.

[21] Appl. No.: 271,534

[22] Filed: Jul. 7, 1994

Related U.S. Application Data

[63] Continuation-in-part of Ser. No. 124,059, Sep. 21, 1993, abandoned.

[51] Int. Cl.⁶ .................................... H01S 3/19
[52] U.S. Cl. .................................. 372/46; 372/45; 372/92; 372/99
[58] Field of Search ................ 372/45, 46, 92, 96, 372/99

[56] References Cited

U.S. PATENT DOCUMENTS 5,164,949  11/1992  Ackley et al. ............ 372/96
5,293,392  3/1994  Shieh et al. ............. 372/96

*Primary Examiner*—James W. Davie
*Attorney, Agent, or Firm*—Eugene A. Parsons

[57] ABSTRACT

A top-emitting vertical cavity surface emitting laser with a current blocking layer at the substrate and offset layers in the mirror stack providing an optical waveguide aligned to the injected current distribution.

27 Claims, 4 Drawing Sheets

VCSEL WITH CURRENT BLOCKING LAYER OFFSET

This application is a continuation-in-part of prior application Ser. No. 08/124,059, filed Sep. 21, 1993, now abandoned.

FIELD OF THE INVENTION

The present invention pertains to vertical cavity surface emitting lasers (VCSEL) and more specifically to VCSELs with improved operating characteristics.

BACKGROUND OF THE INVENTION

In general, vertical cavity surface emitting lasers (VCSELs) must incorporate both a means for confining the injection current and a means for forming an optical waveguide. VCSELs may be configured to emit either through the substrate (bottom-emitting) or through the top of the structure (top-emitting), and each configuration has been characterized by a particular device structure. The bottom-emitting devices have generally employed mesas etched through the top mirror stack, and perhaps through the gain regions as well. With the addition of a contact metal on the top of the mesa, optical waveguiding and current confinement are achieved. However, for many reasons such as packaging and reliability, a mesa etched structure is undesirable. Also, the mesa structure produces a very strong optical waveguide which tends to operate in many lateral modes, leading to an unstable output beam and poor coupling to optical systems or fibers. Top emitting VCSELs have generally employed gain-guided structures where the current is confined by ion implanting a resistive region into the top layers, and where the combination of the injected current and the temperature distribution across the device serves to provide the optical waveguide. These devices have increased thresholds and instabilities under modulation. There is thus a pressing need for a top emitting device with good current confinement and a stable optical waveguide.

It is the purpose of this invention to provide a new and improved method for fabricating a VCSEL with a built-in optical waveguide accurately aligned to the current distribution.

It is a further purpose of this invention to achieve the stable optical waveguide in a nearly planar device structure.

It is a further purpose of the invention to achieve this alignment of the optical waveguide and injected current using simple fabrication means.

SUMMARY OF THE INVENTION

A current blocking layer at the substrate is utilized to achieve both optical waveguide and the confinement of the electrical current injected into the device. The current blocking layer is first grown on the substrate using well-known epitaxial techniques such as metalorganic vapor phase epitaxy (MOVPE) or molecular beam epitaxy (MBE), with opposite conductivity type to the substrate. Using patterned etching techniques, holes are etched in the current blocking region down to the substrate. The rest of the VCSEL layer structure is then grown over the current blocking layer using the same growth techniques. First the lower mirror stack of the VCSEL is grown with the same conductivity type as the substrate. The layers of the mirror stack are offset into the etched regions in the current blocking layer and contact the substrate, forming a continuous path of the same conductivity type for the electrical current. The offset of the layers is chosen to produce an optical waveguide due to the different refractive indices of the layers of the mirror stack. The offset in the layers continues up through the structure, through the spacer layers and quantum well (QW) forming the active region, and through the top mirror stack. Additional current confinement in the top layer is provide by the implantation of a high resistance layer into the top mirror stack surrounding the offset region.

The problems of fabricating a stable optical waveguide and good current confinement are substantially solved with the VCSEL structure of this invention. A simple planar current blocking layer is grown, patterned and etched, and then the rest of the VCSEL structure is grown. The rest of the processing then follows normal, well known procedures.

BRIEF DESCRIPTION OF THE DRAWINGS

Referring to the drawings wherein like parts are indicated with like characters throughout the figures.

DESCRIPTION OF THE PREFERRED EMBODIMENT

Figure 1:
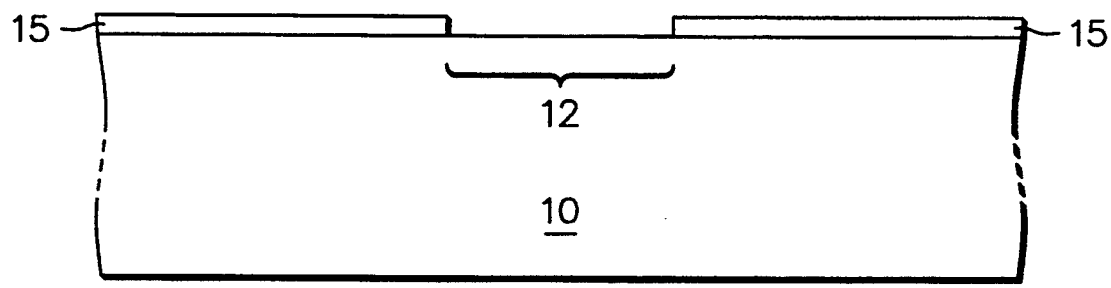
FIG. 1 is a simplified cross-sectional view of a current blocking layer on a substrate.

Referring specifically to FIG. 1, an intermediate step in the fabrication of a VCSEL is illustrated. A substrate 10 is provided which in this embodiment is formed of GaAs and heavily doped to provide n-type conduction. A parallel current blocking layer 15 is formed on the surface of substrate 10 and doped to provided p-type conduction. The thickness of layer 15 is chosen to be approximately $\frac{1}{4}$ of the wavelength of the emission of the laser propagating in layer 15. A centrally located region 12 is etched through the current blocking region and down to the substrate using conventional photlithographic and etching techniques. The lateral size of region 12 is determined by the desired optical mode size and is typically in the range 5–15 $\mu$m. In this preferred embodiment current blocking layer 15 is composed of InGaP lattice matched to the GaAs substrate. InGaP is readily etched with reactions that do not etch GaAs thus forming a suitable selectively etched layer.

Figure 2:
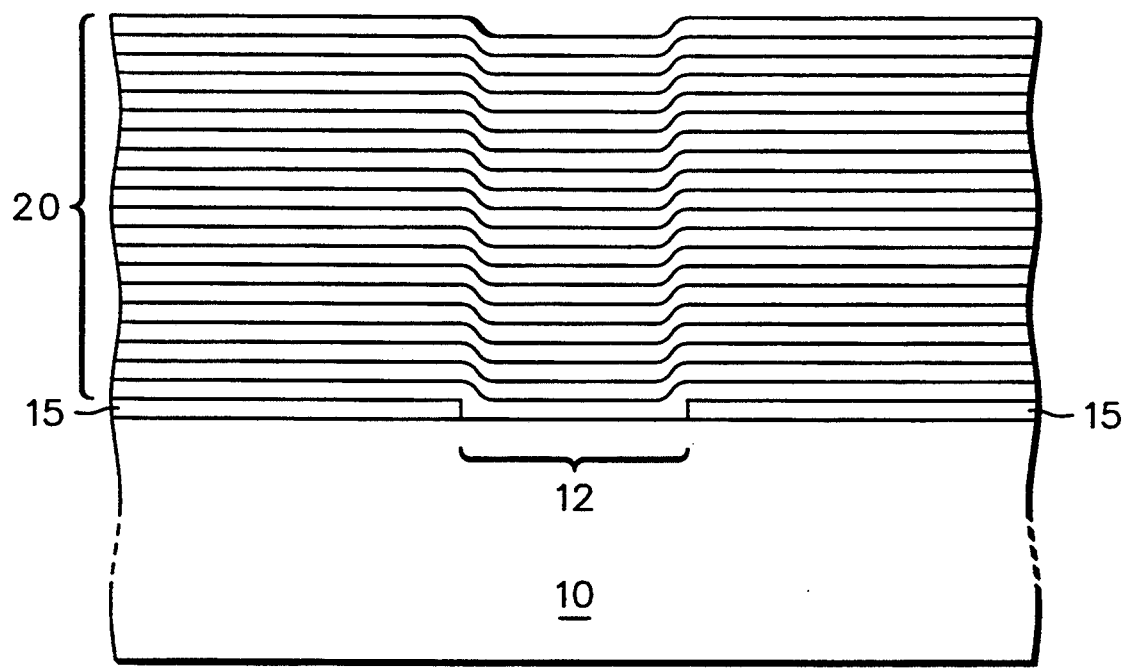
FIG. 2 is a simplified cross sectional view of the current blocking layer and first mirror stack illustrating the offset of the mirror stack over the etched region of the current blocking layer.

Referring specifically to FIG. 2, a parallel bottom mirror stack 20 doped to provide n-type conduction is formed on the current blocking layer centrally located over the offset region. In this preferred embodiment the stack 20 is composed of alternating layers of $Al_{0.15}Ga_{0.85}As$ and $Al_{0.8}Ga_{0.2}As$, each layer of thickness equal to $\frac{1}{4}$ of the wavelength of the laser emission propagating in the layer. As stack 20 is formed over central region 12 each layer is offset, with the first layer being offset down to substrate 10 by the thickness of blocking layer 15. This substantially bounds the $Al_{0.15}Ga_{0.85}As$ layers in central region 12 laterally by $Al_{0.8}Ga_{0.2}As$ and vice-versa, and creates a built-in optical waveguide due to the refractive index differences between the layers. Also, since the n-conducting layers of mirror stack 20 are in contact with the n-conducting substrate 10 in central region 12, current flow through central region 12 is unimpeded by blocking layer 15. Outside central region 12, however, the reverse biased p-n junctions formed by blocking layer 15 and stack 20 substantially impede current flow outside central region 12.

Figure 3:
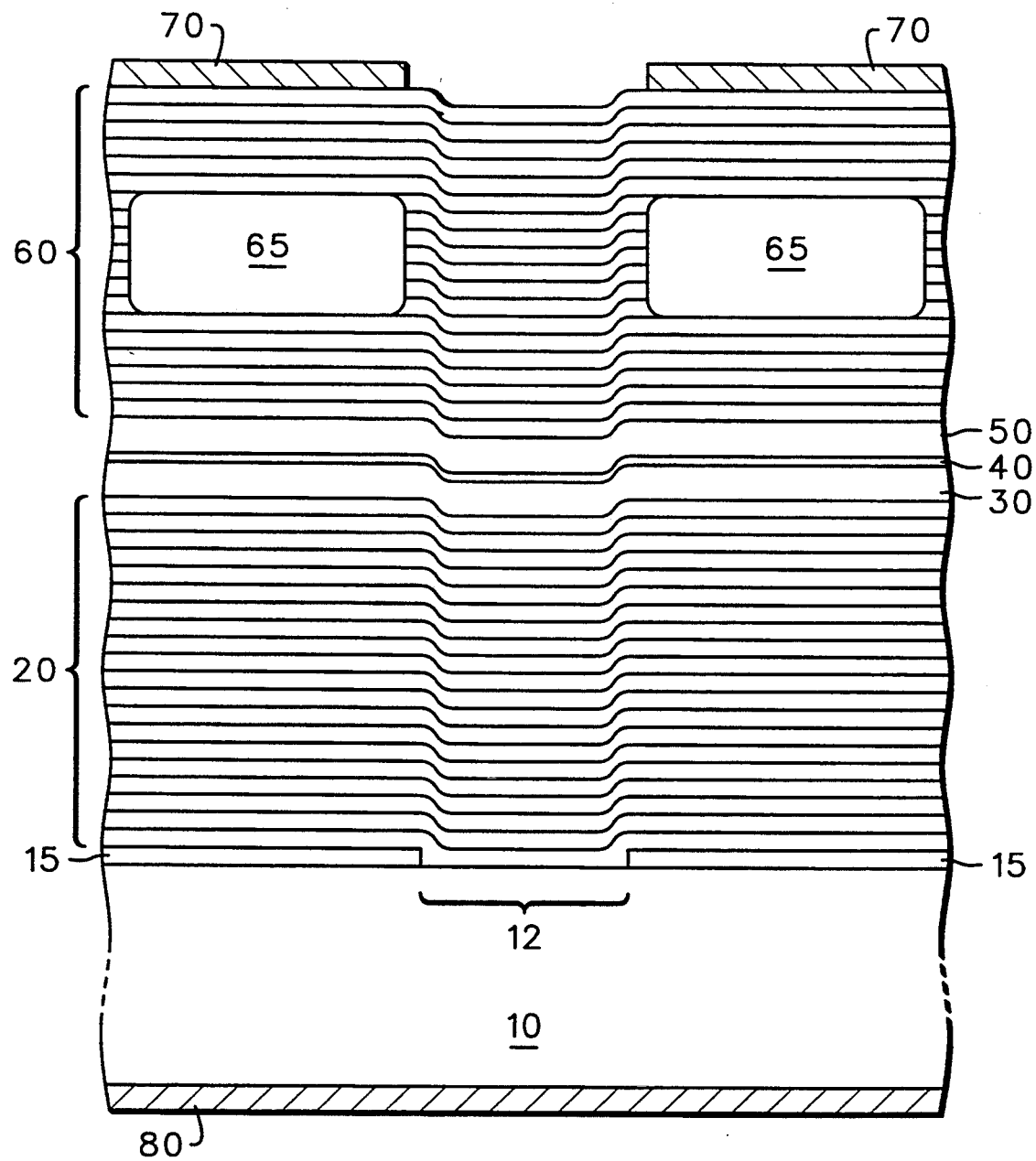
FIG. 3 is a simplified cross-sectional view of a complete VCSEL constructed in accordance with the present invention.

An undoped parallel spacer layer 30 of composition $Al_{0.4}Ga_{0.6}As$ is then grown over stack 20, centrally located over offset region 12 as shown specifically in FIG. 3. As is also shown in FIG. 3, an active region 40 consisting of a GaAs quantum well (QW) gain region is grown on top of spacer layer 30 and continues the offset over central region 12. The offset of active region 40 against spacer 30 provides for lateral confinement of injected carriers. A top spacer layer 50 of composition $Al_{0.4}Ga_{0.6}As$ is then located parallel to active region 40 with a similar offset to the layers below. It is followed by a p-doped top mirror stack 60 that is composed of alternating layers of $Al_{0.15}Ga_{0.85}As$ and $Al_{0.8}Ga_{0.2}As$, each layer of thickness equal to ¼ of the wavelength of the laser emission propagating in the layer. The offset over central region 12 forms an optical waveguide similar to and aligned to central region 12 in very much the same way as seen for stack 20. Essentially, a lateral optical index antiguide is formed by the offset in the mirror stacks.

A second means of current confinement 65 is then formed by ion implantation, aligned to central region 12. In the preferred embodiment this second means 65 comprises a proton bombarded region, but it could also comprise a region of implanted n-dopant such as Si to block the current using reverse-biased p-n junctions. The implantation could be patterned by any of several means well known in the art. Specifically, a layer of photoresist is deposited and exposed in a manner to align the exposed regions to central region 12. After removal of the exposed region, an Au implant mask is plated in the exposed region which forms the implant mask.

After implantation, a p-contact 70 is formed using metals well known in the art such as TiPtAu or TiW, deposited by vacuum evaporation, sputtering, or chemical vapor deposition, on mirror stack 50 with a window aligned again to central region 12 using conventional lift-off or etching techniques. An n-contact 80 is then formed on the lower surface of substrate 10 using conventional means comprising metallizations well known in the art, such as Ge/Ni/Au, usually vacuum evaporated.

Figure 4:
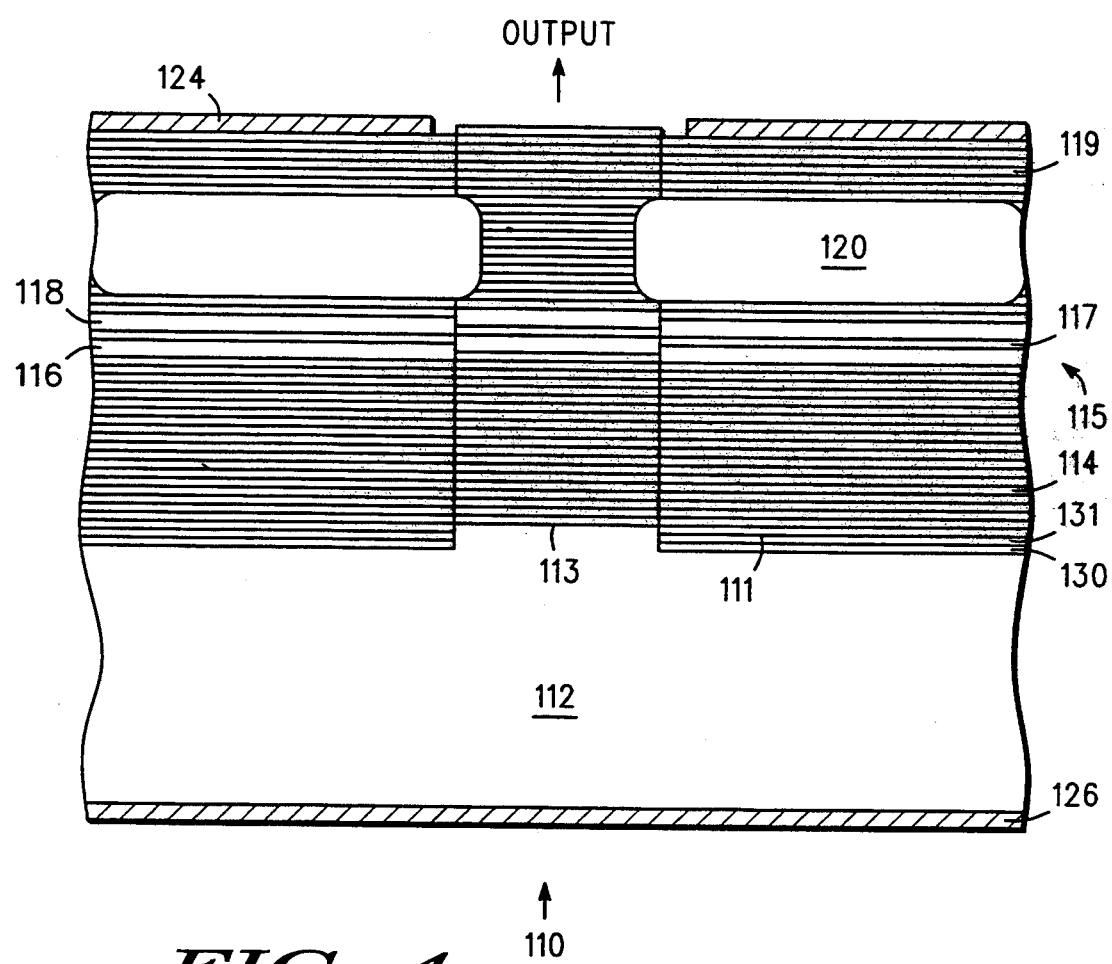
FIG. 4 is a simplified cross-sectional view of another embodiment of a complete VCSEL constructed in accordance with the present invention.

Referring specifically to FIG. 4, another embodiment of a vertical cavity surface emitting laser (VCSEL) 110 is illustrated in a sectional view. VCSEL 110 is formed on a substrate 112, which in this example, is made of n-doped gallium arsenide. Gallium arsenide is used as substrate 112 to facilitate epitaxial growth of multiple layers of aluminum gallium arsenide and aluminum arsenide. It should be understood that VCSEL 110 and substrate 112 are simply utilized for illustrative purposes and many other lasers and other semiconductor substrates could be used.

Substrate 112 has an upper surface 111 on which the active portions of VCSEL 110 are positioned. Prior to positioning the active portions on substrate 112, surface 111 of substrate 112 is etched to form a mesa 113. While etching is a preferred method of forming mesa 113, it should be understood that other methods might be utilized with the important feature being that the surface of mesa 113 lie generally in a plane parallel with a plane through surface 111 but spaced, or offset, therefrom. In this specific embodiment, mesa 113 is round and has a diameter approximately equal to the mode size for the lowest order of operating mode for VCSEL 110. For reasons which will be explained presently, the height of mesa 113, or the amount that the surface of mesa 113 is offset from surface 111, is approximately five eighths of the operating wavelength in the semiconductor layers of VCSEL 110.

In this specific example, a first layer 130 of $Al_{0.8}Ga_{0.2}As$ doped for p-type conduction is formed on the surface 111 of substrate 112 with a thickness of approximately 3/16 $\lambda$ of the laser emission propagating in the layer. A second layer 131 of $Al_{0.15}Ga_{0.85}As$ doped for p-type conduction is formed on the first layer with a thickness of approximately 3/16 $\lambda$ of the laser emission propagating in the layer. In the specific method utilized in this embodiment, the mesa 113 is etched utilizing a dielectric etch mask and well known etching techniques. First and second layers 130 and 131 are formed by epitaxial growth and, by proper choice of the growth temperature and III-V materials ratio, no growth will occur on the dielectric etch mask on mesa 113.

Deposition of alternating layers of doped $Al_{0.8}Ga_{0.2}As$ and $Al_{0.15}Ga_{0.85}As$ form a first stack 114 of reflectors or mirrors for VCSEL 110. First stack 114 is positioned so as to overlie mesa 113 and a surrounding portion of second layer 131. Thicknesses of alternating layers of aluminum gallium arsenide are set at approximately one quarter of the wavelength at which the device is designed to operate. Nominal thicknesses for the aluminum gallium arsenide layers are on the order of 605 angstroms. First mirror stack 114 is typically n-doped with dopants well known in the art, such as Se or Si.

A typical active region 115 is formed as follows, so as to overlie first stack 114 and be approximately coextensive therewith. A first cladding layer 116 is epitaxially deposited on first mirror stack 114 to form a first major surface of active region 115. Cladding layer 116 is typically composed of aluminum gallium arsenide of composition intermediate to the two compositions used in first mirror stack 114. An active layer 117, which consists of a single GaAs quantum well (or multiple GaAs quantum wells separated by 100A barriers of aluminum gallium arsenide) is then epitaxially deposited on cladding layer 116. A second cladding layer 118 of the same aluminum gallium arsenide composition and thickness as cladding layer 116 is then deposited on active layer 117. The total thickness of active region 115 is chosen to be an integral multiple of a half wavelength of the optical emission in the semiconductor material.

A second stack 119 of reflectors or mirrors is epitaxially deposited on the surface of second cladding layer 118 of active region 115 so as to be approximately coextensive therewith. Second mirror stack 119 is composed of alternating layers of p-doped aluminum gallium arsenide and aluminum arsenide, typical p-dopant includes Be or C. Thickness of the last alternating layer is approximately one half wave length instead of one quarter wave length as is used for the other alternating layers. Generally, the threshold current of a VCSEL is reduced by increasing the number of alternating layers in mirror stacks 114 and 119. A buried implant 120 is formed in second stack 119, as previously described with relation to FIG. 3, to form a different conductivity or a high resistivity layer to confine current to the region above mesa 113. A first metal contact layer 124 is formed on the upper surface of second mirror stack 119 and a second metal contact layer 126 is formed somewhere on substrate 112.

Using growth techniques, such as MOCVD or MBE, well known in the art, each of first mirror stack 114, active region 115 and second mirror stack 118 generally follow the contours of second layer 131 and mesa 113 which they overlie. By forming mesa 113 approximately $\frac{3}{8} \lambda$ and by forming each of layers 130 and 131 approximately 3/16 $\lambda$, the remaining portion of mesa 113 is approximately $\frac{1}{4} \lambda$ thick. Thus, each layer in first mirror stack 114, active region 115 and second mirror stack 119 includes an offset of approximately one quarter wavelength directly above the edges, or outer limit, of mesa 113. Since each layer in first and second mirror stacks 114 and 119 is approximately one quarter wavelength thick, the portion of each layer which overlies mesa 113 is substantially aligned with, or bounded by, the portion of the next succeeding layer which overlies surface 111 surrounding mesa 113. Further, alternating layers of aluminum gallium arsenide with different indexes of refraction are used. Thus, for example, each layer of aluminum gallium arsenide is bounded at the offset by the next layer of aluminum gallium arsenide. As will be understood, the offset can be any desired odd multiple of one quarter wavelength, but a single one quarter wavelength is chosen here for simplicity of construction and understanding.

It should also be understood that first and second layers 130 and 131 are doped for p-type conduction so that a reverse biased p-n junction is formed with first mirror stack 114 and, thus, first and second layers 130 and 131 form a current blocking region. Also, it should be understood that first and second layers 130 and 131 cooperate to provide modulation of the reflectivity of first mirror stack 114. This modulation reduced the Q in the regions outside of the waveguide or resonator area (the resonator area being the area overlying mesa 113) by approximately 20%. The lasing mode of VCSEL 110 then experiences the lowest loss by propagating in the highest-Q region above mesa 113 and, thus, the optical mode is formed with excellent overlap of the current distribution In a slightly different embodiment, mesa 113 could be formed $\frac{1}{4} \lambda$ high (or it could be replaced with a $\frac{1}{4} \lambda$ depression) and the current blocking region could be formed by doping or implanting substrate 112 to provide p-type conduction in the area surrounding mesa 113. Thus, the offset defining a waveguide or resonator area would be present to confine the optical activity while the current blocking would be present to confine the current flow to the waveguide or resonator area. In this embodiment the optical modulation, or phase shift, would not be present but the waveguiding would rely strictly on the offset.

Figure 5:
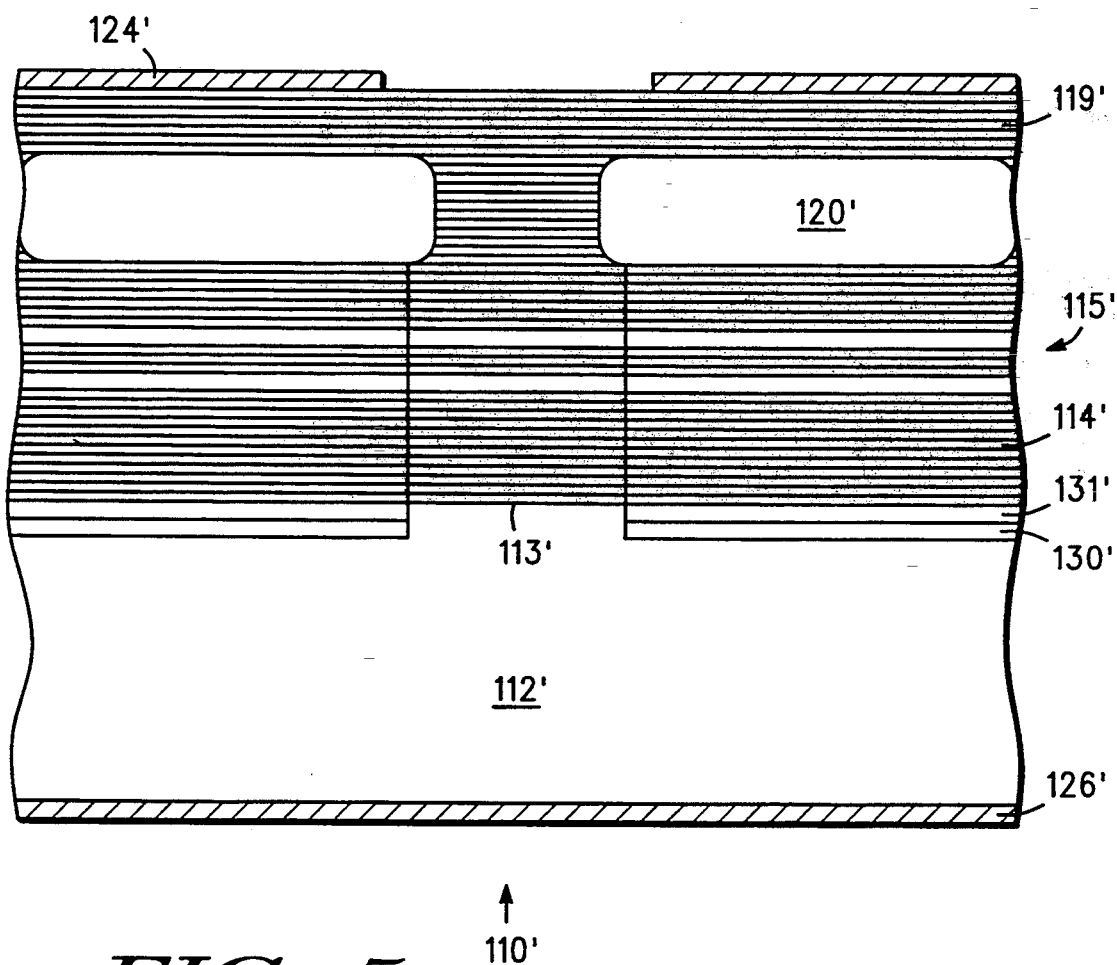
FIG. 5 is a simplified cross-sectional view of still another embodiment of a complete VCSEL constructed in accordance with the present invention.

Referring specifically to FIG. 5, yet another embodiment of a vertical cavity surface emitting laser (VCSEL) 110' is illustrated in a sectional view. Components illustrated in FIG. 5 which are similar to components of FIG. 4 are designated with a similar number having a prime added to indicate the different embodiment. Basically, the embodiment of FIG. 5 is similar to the embodiment of FIG. 4 except that a mesa 113' is the same height as first and second layers 130' and 131', forming a current blocking region. In this embodiment, no offset of first mirror stack 114', active region 115' and second mirror stack 119' is provided. Thus, in this embodiment it is important that first and second layers 130' and 131' are the correct height to provide the optical modulation, or phase shift, which reduces the Q in the regions outside of the waveguide or resonator area (the resonator area being the area overlying mesa 113'). VCSEL 110' can also be fabricated, in some specific embodiments, by doping or implanting layers 130' and 131' in substrate 112' adjacent the surface thereof. While the explanation above describes first and second layers as 3/16 $\lambda$ thick, it will be understood that throughout the various embodiments any thickness that will provide the desired phase shift and consequent reduction in Q to aid in limiting the lasing to a desired region can be utilized.

While the description incorporated herein describes the fabrication of a single vertical cavity surface emitting laser, it should be understood that substrate 10 may be a whole semiconductor wafer, and that thousands of VCSEL devices as described herein would be fabricated simultaneously.

Thus, a top-emitting VCSEL is disclosed which incorporates a current blocking layer self-aligned to a built-in optical waveguide. The VCSEL is constructed using two-step growth, first by depositing a current blocking layer which is then patterned, followed by growth of the rest of the VCSEL structure. The offset in the mirror stacks produced by the patterning and etching of the current blocking layer produces a built-in optical waveguide which is self-aligned to the current blocking layer for maximum overlap of the optical mode with the injected current, resulting in a top-emitting VCSEL with unusually high efficiency and a stable optical mode.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. An optical waveguide for a vertical cavity surface emitting laser having an emission wavelength comprising:

a semiconducting substrate of a first conductivity type with a surface lying in a first plane;

a semiconducting current blocking region of a second conductivity type positioned on the substrate with a surface lying in a second plane substantially parallel to and spaced from the first plane, the current blocking region having a centrally located region removed down to the first plane and a predetermined thickness;

a first semiconducting mirror stack of first conductivity type positioned so as to overlie the centrally located region and a portion of the current blocking region surrounding the centrally located region, with an area over the centrally located region aligned to the first plane and an area over the surrounding portion aligned to the second plane so as to produce an offset in the first mirror stack substantially equal to the thickness of the current blocking region;

a first spacer layer of intermediate bandgap positioned on the first mirror stack in such a way as to produce an offset in the first spacer layer substantially equal to the thickness of the current blocking region;

an active region having at least a quantum well and barriers positioned on the first spacer layer in such a way as to produce an offset in the active region substantially equal to the thickness of the current blocking region;

a second spacer layer of intermediate bandgap positioned on the active region in such a way as to produce an offset in the second spacer layer substantially equal to the thickness of the current blocking region; and a second semiconducting mirror stack of second conductivity type positioned on the second spacer layer in such a way as to produce an offset in the second semiconducting mirror stack substantially equal to the thickness of the current blocking region.

2. An optical waveguide for a vertical cavity surface emitting laser as claimed in claim 1 wherein the thickness of the current blocking region is approximately an odd multiple of ¼ of the emission wavelength propagating in the first and second mirror stacks.

3. An optical waveguide for a vertical cavity surface emitting laser as claimed in claim 1 wherein the substrate is semi-insulating and the current blocking region includes two layers with the first layer having a first conductivity type and the second layer having a second conductivity type.

4. An optical waveguide for a vertical cavity surface emitting laser as claimed in claim 2 wherein the current blocking region consists of an odd multiple of ¼-wave layers of alternating conductivity type.

5. An optical waveguide for a vertical cavity surface emitting laser as claimed in claim 2 wherein the first mirror stack includes alternating layers of high and low refractive index materials, each layer having a thickness equal to ¼ of the emission wavelength of the laser propagating in the layer.

6. An optical waveguide for a vertical cavity surface emitting laser as claimed in claim 5 wherein the top mirror stack includes alternating layers of high and low refractive index materials, each layer having a thickness equal to ¼ of the emission wavelength of the laser propagating in the layer.

7. An optical waveguide for a vertical cavity surface emitting laser as claimed in claim 6 wherein the offset in the current blocking region serves to align the high refractive index layers of the first and top mirror stacks to the low refractive index layers, and vice-versa.

8. An optical waveguide for a vertical cavity surface emitting laser as claimed in claim 1 wherein a lateral optical waveguide is formed by the offset in the first and second mirror stacks.

9. An optical waveguide for a vertical cavity surface emitting laser as claimed in claim 1 wherein a lateral optical index antiguide is formed by the offset in the first and second mirror stacks.

10. An optical waveguide for a vertical cavity surface emitting laser as claimed in claim 1 including in addition a resistive region formed in the second mirror stack and aligned about but not over the central region of the current blocking region so as to provide a second means of current confinement.

11. An optical waveguide for a vertical cavity surface emitting laser as claimed in claim 10 wherein the additional resistive region is provided by an implanted region of opposite conductivity type to the second mirror stack.

12. An optical waveguide for a vertical cavity surface emitting laser as claimed in claim 1 wherein the active region is offset against the first and second spacer layers to provide lateral confinement of injected carriers.

13. An optical waveguide for a vertical cavity surface emitting laser having an emission wavelength comprising:

a semiconducting substrate of a first conductivity type with a surface defining a first plane;

a semiconducting current blocking region of a second conductivity type positioned adjacent the surface of the substrate with a surface lying in a second plane substantially parallel to and spaced from the first plane, the current blocking region defining and surrounding a centrally located region of the substrate lying in the first plane;

a first semiconducting mirror stack of first conductivity type positioned so as to overlie the centrally located region and a portion of the current blocking region surrounding the centrally located region, with an area over the centrally located region aligned to the first plane and an area over the surrounding portion aligned to the second plane so as to produce an offset in the first mirror stack;

a first spacer layer of intermediate bandgap positioned on the first mirror stack in such a way as to produce an offset in the first spacer layer;

an active region having at least a quantum well and barriers positioned on the first spacer layer in such a way as to produce an offset in the active region;

a second spacer layer of intermediate bandgap positioned on the active region in such a way as to produce an offset in the second spacer layer; and a second semiconducting mirror stack of second conductivity type positioned on the second spacer layer in such a way as to produce an offset in the second semiconducting mirror stack.

14. An optical waveguide for a vertical cavity surface emitting laser as claimed in claim 13 wherein the surface of the current blocking region lying in the second plane is spaced from the first plane approximately an odd multiple of ¼ of the wavelength of the laser emission propagating in the first and second semiconducting mirror stacks.

15. An optical waveguide for a vertical cavity surface emitting laser as claimed in claim 13 wherein the current blocking region includes two layers having a combined thickness that reduces the Q of the portion of the first and second semiconducting mirror stacks overlying the current blocking region.

16. An optical waveguide for a vertical cavity surface emitting laser as claimed in claim 14 wherein the current blocking region includes two semiconducting layers each approximately 3/16 of the wavelength of the laser emission propagating in the two semiconductor layers.

17. An optical waveguide for a vertical cavity surface emitting laser as claimed in claim 14 wherein the first mirror stack includes alternating layers of high and low refractive index materials, each layer having a thickness equal to ¼ of the emission wavelength of the laser propagating in the layer.

18. An optical waveguide for a vertical cavity surface emitting laser as claimed in claim 17 wherein the second mirror stack includes alternating layers of high and low refractive index materials, each layer having a thickness equal to ¼ of the emission wavelength of the laser propagating in the layer.

19. An optical waveguide for a vertical cavity surface emitting laser as claimed in claim 13 including in addition a resistive region formed in the second mirror stack and aligned about but not over the centrally located region of the substrate so as to provide a second means of current confinement.

20. An optical waveguide for a vertical cavity surface emitting laser as claimed in claim 19 wherein the additional resistive region includes an implanted region of opposite conductivity type to the second mirror stack.

21. An optical waveguide for a vertical cavity surface emitting laser as claimed in claim 13 wherein the active region is offset against the first and second spacer layers to provide lateral confinement of injected carriers.

22. An optical waveguide for a vertical cavity surface emitting laser having an emission wavelength comprising:
 a semiconducting substrate of a first conductivity type with a surface lying in a first plane;
 a semiconducting current blocking region of a second conductivity type formed adjacent the surface of the substrate and defining a centrally located region of the substrate of the first conductivity type and surrounded by the current blocking region;
 a first semiconducting mirror stack of first conductivity type positioned so as to overlie the centrally located region and a portion of the current blocking layer surrounding the centrally located region;
 a first spacer layer of intermediate bandgap positioned on the first mirror stack;
 an active region having at least a quantum well and barriers positioned on the first spacer layer;
 a second spacer layer of intermediate bandgap positioned on the active region; and
 a second mirror stack of second conductivity type positioned on the second spacer layer.

23. An optical waveguide for a vertical cavity surface emitting laser as claimed in claim 22 wherein the current blocking region includes one of an implant and a doped region in the substrate.

24. An optical waveguide for a vertical cavity surface emitting laser as claimed in claim 22 wherein the current blocking region includes two layers positioned on the surface of the substrate and having a combined thickness that reduces the Q of the portion of the first and second semiconducting mirror stacks overlying the current blocking region.

25. An optical waveguide for a vertical cavity surface emitting laser as claimed in claim 24 wherein each of the two semiconducting layers of the current blocking region have a thickness approximately 3/16 of the wavelength of the laser emission propagating in each of the two semiconductor layers, respectively.

26. An optical waveguide for a vertical cavity surface emitting laser as claimed in claim 22 including in addition a resistive region formed in the second mirror stack and aligned about but not over the centrally located region of the substrate so as to provide a second means of current confinement.

27. An optical waveguide for a vertical cavity surface emitting laser as claimed in claim 26 wherein the additional resistive region includes an implanted region of opposite conductivity type to the second mirror stack.

* * * * *